(12) United States Patent  
Tanaka

(10) Patent No.: US 8,604,514 B2  
(45) Date of Patent: Dec. 10, 2013

(54) SEMICONDUCTOR DEVICE

(75) Inventor: Hiroaki Tanaka, Nissin (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 95 days.

(21) Appl. No.: 13/239,781

(22) Filed: Sep. 22, 2011

(65) Prior Publication Data

US 2012/0007139 A1      Jan. 12, 2012

Related U.S. Application Data

(63) Continuation of application No. PCT/JP2009/055827, filed on Mar. 24, 2009.

(51) Int. Cl.  
*H01L 29/66*       (2006.01)

(52) U.S. Cl.  
USPC ........................... 257/139; 257/577

(58) Field of Classification Search  
USPC ................ 257/139–145, 173, 174, 197, 198, 257/565–593; 438/309–378  
See application file for complete search history.

(56) References Cited

U.S. PATENT DOCUMENTS

| | | | |
|---|---|---|---|
| 5,463,241 A * | 10/1995 | Kubo | ............................ 257/376 |
| 5,530,277 A | 6/1996 | Otsuki et al. | |
| 5,557,128 A | 9/1996 | Yamazaki et al. | |
| 5,559,355 A | 9/1996 | Yamazaki et al. | |
| 5,621,601 A | 4/1997 | Fujihira et al. | |
| 6,069,372 A * | 5/2000 | Uenishi | .......................... 257/139 |
| 6,153,896 A | 11/2000 | Omura et al. | |
| 6,180,966 B1 * | 1/2001 | Kohno et al. | .................. 257/173 |
| 6,534,998 B1 | 3/2003 | Omura et al. | |
| 2002/0030237 A1 | 3/2002 | Omura et al. | |
| 2003/0117758 A1 | 6/2003 | Yoshida | |
| 2004/0155287 A1 | 8/2004 | Omura et al. | |
| 2005/0286194 A1 * | 12/2005 | Fujiki et al. | .................... 361/100 |
| 2006/0145230 A1 | 7/2006 | Omura et al. | |
| 2009/0189219 A1 * | 7/2009 | Shinbori et al. | .............. 257/334 |
| 2009/0230500 A1 * | 9/2009 | Yoshikawa et al. | ........... 257/470 |

FOREIGN PATENT DOCUMENTS

| | | |
|---|---|---|
| JP | 7-161992 A | 6/1995 |
| JP | 7-245394 A | 9/1995 |
| JP | 8-046193 A | 2/1996 |
| JP | 2002-083963 A | 3/2002 |
| JP | 2002-319677 A | 10/2002 |

(Continued)

OTHER PUBLICATIONS

International Search Report mailed Jun. 9, 2009 of PCT/JP2009/055827.

(Continued)

*Primary Examiner* — Fernando L Toledo  
*Assistant Examiner* — Karen Kusumakar  
(74) *Attorney, Agent, or Firm* — Kenyon & Kenyon LLP

(57) ABSTRACT

The present teachings provides a bipolar semiconductor device comprising: a main cell region consisting of a trench gate type element region; and a sense cell region including a planar gate type element region.

5 Claims, 16 Drawing Sheets

(56) References Cited

FOREIGN PATENT DOCUMENTS

| | | |
|---|---|---|
| JP | 2003-188382 A | 7/2003 |
| JP | 2003-197913 A | 7/2003 |
| JP | 2003-264289 A | 9/2003 |
| JP | 2005-174996 A | 6/2005 |
| JP | 2005-260100 A | 9/2005 |
| JP | 2005-322781 A | 11/2005 |
| JP | 2006-173357 A | 6/2006 |
| JP | 2007-287988 A | 11/2007 |
| JP | 2008-258262 A | 10/2008 |
| JP | 2009-117786 A | 5/2009 |

OTHER PUBLICATIONS

Written Opinion (PCT/ISA/237) mailed Jun. 9, 2009 of PCT/JP2009/055827 in Japanese.

International Preliminary Report on Patentability (PCT/IPEA/209) mailed Apr. 15, 2011.

Translation of Written Opinion (PCT/ISA/237) mailed Jun. 9, 2009 of PCT/JP2009/055827.

Translation of International Preliminary Report on Patentability (PCT/IPEA/209) mailed Apr. 15, 2011.

* cited by examiner

SEMICONDUCTOR DEVICE

CROSS-REFERENCE TO RELATED APPLICATION

This application is a continuation of PCT application PCT/JP2009/055827 filed on Mar. 24, 2009 designating the United States of America, the entire contents of which are incorporated by reference herein.

TECHNICAL FIELD

The present teachings relate to an insulation gate bipolar semiconductor device.

DESCRIPTION OF RELATED ART

In a semiconductor device, in order to prevent element breakdown by an overcurrent, or for other purposes, a current detection portion for detecting the current flowing through the semiconductor device is provided. For example, a semiconductor device 900 of Japanese Patent Application Publication No. 2007-287988 includes a main cell region 981, and a sense cell region 982 for detecting the current flowing through the main cell region 981. In the main cell region 981 and the sense cell region 982, as shown in FIG. 18, there are formed trench type insulated gate bipolar transistors (IGBTs). The semiconductor device 900 includes a semiconductor substrate in which a $P^+$ type collector region 903, an $N^-$ type drift region 908, and a $P-$ type body region 901 are laminated in this order. On the upper surface side of the body region 901, $N^+$ type emitter regions 905 and contact regions 906 are provided. Trench gates 904 penetrating through the body region 901 from the upper surface side of the semiconductor substrate are provided. The trench gates 904 are in contact with their corresponding emitter regions 905 on the upper surface side of the semiconductor substrate. In each trench gate 904, there is filled a gate electrode covered with a gate insulation film. On the upper surface of the gate electrode, an interlayer insulation film 912 is provided. On the back surface side of the semiconductor substrate, a collector electrode 913 electrically continuous with the collector region 903 is provided. On the upper surface side of the semiconductor substrate, an emitter main electrode 911 electrically continuous with the emitter regions 905 and the contact regions 906 in the main cell region 981, and an emitter sense electrode 921 electrically continuous with the emitter regions 905 and the contact regions 906 in the sense cell region 982 are provided.

The collector electrode 913 is provided at a positive potential with respect to the emitter main electrode 911 and the emitter sense electrode 921, and the gate electrode is applied with a positive voltage. Accordingly, electrons are attracted to the trench gates 904. As a result, in portions of the body region 901 in contact with the trench gates 904, channels inverted to N type are formed. Electrons are injected through the channels from the emitter regions 905 into the drift region 908. Further, holes are injected from the collector region 903 into the drift region 908. When holes which are minority carriers are injected into the drift region 908, the density of electrons which are majority carriers increases in order to keep the neutrality condition for carriers in the drift region 908 (so-called conductivity modulation). As a result, the resistance of the drift region 908 is reduced. Such movement of the electrons and holes results in flow of a main current and a sense current passing from a back surface side (collector region 903 side) toward an upper surface side (emitter region 905 side) of the semiconductor device 900. By adjusting an area ratio of the main cell region 981 and the sense cell region 982, or other procedures, the ratio of the main current and the sense current is previously adjusted. As a result, it is possible to detect the main current (=sense current value×sense ratio) by measuring the sense current value.

Incidentally, in the IGBT of Japanese Patent Application Publication No. 2007-287988, the holes injected from the collector region into the drift region are partly attracted to electrons flowing along the gates. This results in an increase in hole density of the vicinity of the surface of the drift region (the vicinity of the surface on the body side), which affects the resistance value of the IGBT. Particularly, for the trench type IGBT having a small unit cell area, the hole density per unit area becomes higher. Accordingly, the resistance value tends to be affected by the change in the hole density. The hole density affecting the resistance value varies according to the size (trench depth) of each trench type gate. For this reason, variations in trench depth result in variations in the hole density, which becomes a large factor causing variations in resistance of the trench type IGBTs.

In a semiconductor device including a main cell region and a sense cell region, the sense cell region is smaller in number of cells than the main cell region. Accordingly, in the case of a semiconductor device including a trench type main cell region and a trench type sense cell region as the semiconductor device of Japanese Patent Application Publication No. 2007-287988, variations in trench depth among semiconductor devices result in small variations in resistance of the main cell region, but result in large variations in resistance of the sense cell region. For this reason, in the semiconductor device of Japanese Patent Application Publication No. 2007-287988, slight variations in trench depth among semiconductor devices result in a slight change in the main current, but, in contrast, result in a large change in the sense current. This changes the ratio of the current values of the sense current and the main current among semiconductor devices. Accordingly, it becomes impossible to detect the main current flowing through the main cell region with high precision.

SUMMARY

The present teachings were made in view of such respects. An object of the present teachings is to inhibit the variations in the sense current caused by the variations in the trench depth, and to stabilize the current detection precision.

Thus, a semiconductor device disclosed in this specification is a bipolar semiconductor device, and includes a main cell region consisting of a trench gate type element region, and a sense cell region including a planar gate type element region.

According to the semiconductor device, for the main cell region, a trench gate type element region that is advantageous for high integration is used. Whereas, the sense cell region includes a planar gate type element region in at least a part thereof. When the planar gate type element is used, the density of carriers (holes for N type channel) per unit area becomes smaller as compared with the trench gate type element. For this reason, even when the carrier density varies, the variation in the sense current is trivial. This can stabilize the ratio of the main current flowing through the main cell region and the sense current flowing through the sense cell region. Accordingly, when the semiconductor devices are mass-produced, the detection precision of the sense cell region becomes less likely to vary.

DETAILED DESCRIPTION OF INVENTION

Preferred aspects of below embodiments will be listed. In a semiconductor device, in a trench gate type element region, a first conductivity type collector region, a second conductivity type drift region laminated on the collector region, a first conductivity type body region laminated on the drift region, a second conductivity type emitter region formed on an upper surface side of the body region, and a trench type insulation gate extending while penetrating the body region and the emitter region may be provided. Whereas, in the planar gate type element region, a first conductivity type collector region, a second conductivity type drift region laminated on the collector region, a second conductivity type emitter region formed on an upper surface side of the drift region, a first conductivity type body region which separates the emitter region from the drift region, and a planar gate type insulation gate opposing an area of the body region that separates the emitter region and the drift region, a part of the emitter region adjacent to the area of the body region, and a part of the drift region adjacent to the area of the body region may be provided.

In the drift region of the planar gate type element region of the sense cell region, a second conductivity type carrier accumulation region may be included in a position that is opposing the planar gate type insulation gate and is at a depth between the planar gate type insulation gate and the collector region. This can reduce the resistance value of the planar gate type element region.

The sense cell region may include a trench gate type element region and a planar gate type element region. In this case, preferably, the planar gate type element region is provided in a center portion of the sense cell region, and the trench gate type element region is provided in an edge portion of the sense cell region. This can contribute to the improvement of the durability to breakdown voltage of the sense cell region.

In accordance with the present teachings, in the insulation gate bipolar semiconductor device including the main cell region and the sense cell region, the variations in the sense current can be inhibited, which can stabilize the current detection stability.

Further aspects of below embodiments will be listed.

1. As a first conductivity type, a P type semiconductor is used, and as a second conductivity type, an N type semiconductor is used.

2. At a periphery of a semiconductor element including a main cell region and a sense cell region, a peripheral termination structure portion is provided.

[Embodiment 1]

Figure 1:
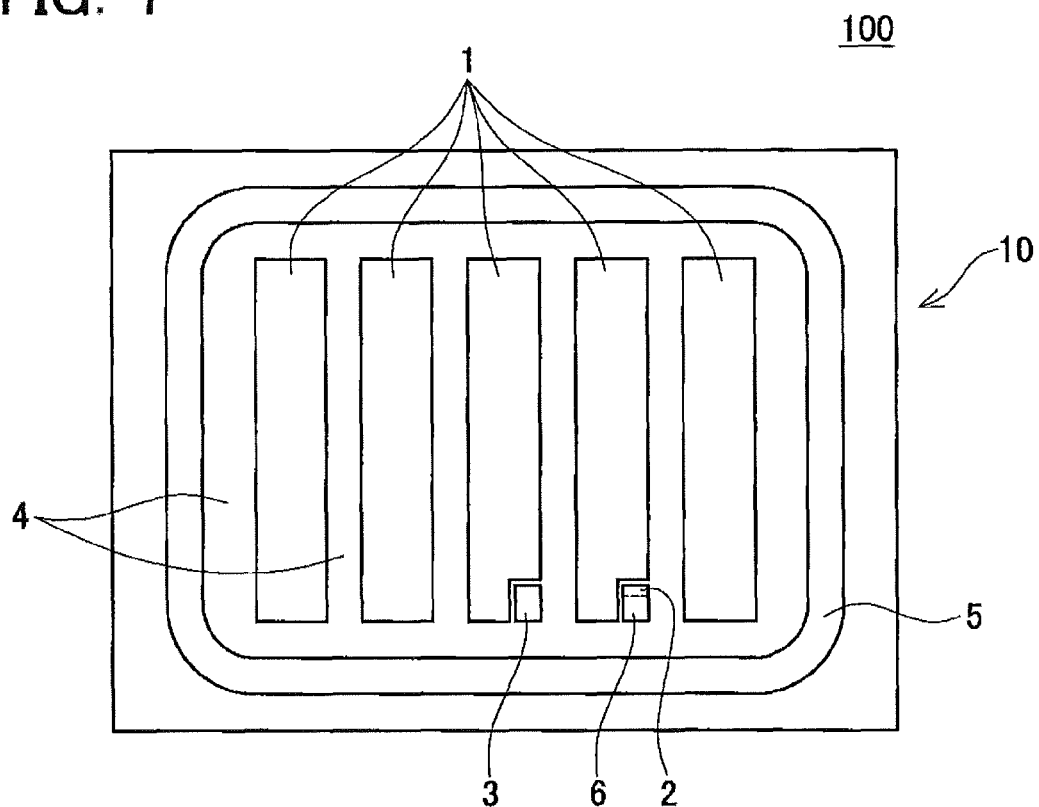
FIG. 1 is a plan view showing a semiconductor device of an embodiment.
Figure 2:
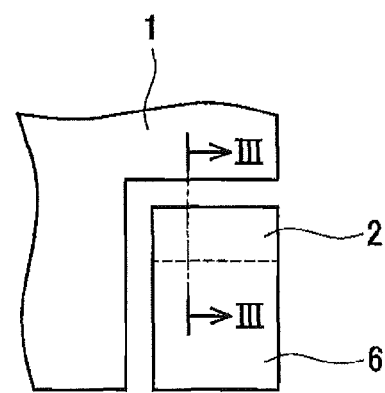
FIG. 2 is an enlarged view of the vicinity of a sense cell region of FIG. 1.
Figure 3:
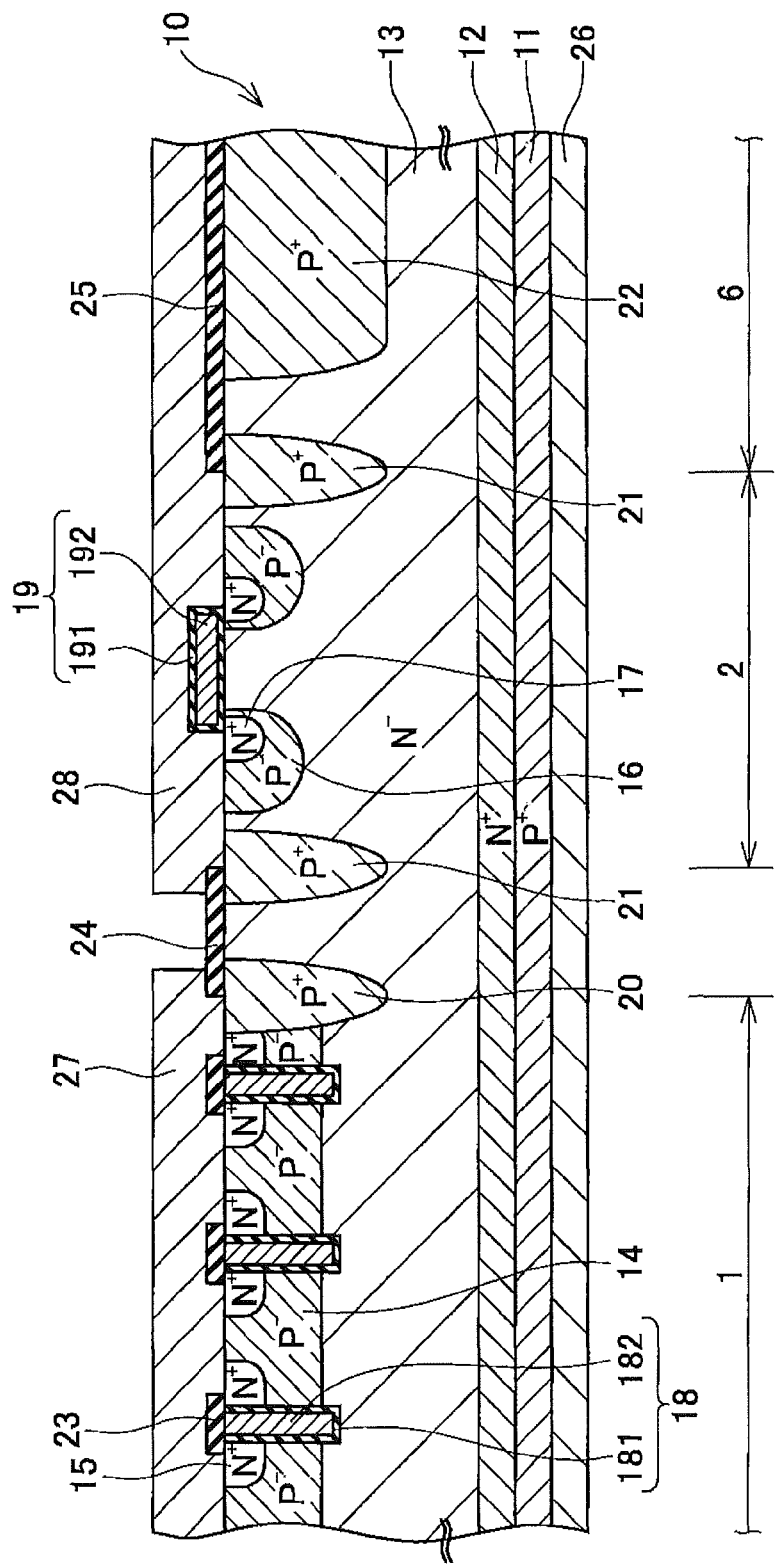
FIG. 3 is an enlarged view of a cross section along line of FIG. 2.

FIG. 1 is a plan view of a semiconductor device 100 in accordance with the present embodiment. FIG. 2 is an enlarged view of the vicinity of a sense cell region 2 of FIG. 1. FIG. 3 is a cross-sectional view along line of FIG. 2. The semiconductor device 100 includes a plurality of main cell regions 1, one sense cell region 2, a gate pad 3, a gate wiring portion 4, a peripheral termination structure portion (Field Limiting Ring: FLR) 5, and a sense cell pad portion 6.

The semiconductor device 100 includes a semiconductor substrate 10 in which a $P^+$ type collector region 11, an $N^+$ type buffer region 12, and an $N^-$ type drift region 13 are sequentially laminated in this order.

The main cell region 1 includes a $P^-$ type body region 14 formed on the surface of the drift region 13, $N^+$ type emitter regions 15 formed on the surface of the body region 14, and trench gates 18 penetrating through the body region 14 from the upper surface of the semiconductor substrate 10 toward the drift region 13. Around the main cell region 1, a $P^+$ diffusion region 20 is formed as an inactive region for element isolation. Incidentally, in the present embodiment, in the peripheral termination structure portion 5, the same diffusion region as the $P^+$ diffusion region 20 is also formed.

Respective trench gates 18 are in contact with their corresponding emitter regions 15 on the upper surface side of the semiconductor substrate 10, and reach into the drift region 13 at respective bottom ends thereof. The depth of each trench gate 18 (the length in a direction perpendicular to the direction of lamination of the semiconductor substrate 10) is larger than the depth of the $P^-$ body region 14, and smaller than that of the $P^+$ diffusion region 20. In the trench gate 18, a gate electrode 182 covered with a gate insulation film 181 is filled.

The collector region 11 is electrically connected with a collector electrode 26. The emitter regions 15 are electrically connected with the emitter main electrode 27. On the upper surface of each trench gate 18, an interlayer insulation film 23 is formed. These insulate the emitter main electrode 27 from the trench gates 18. On a part of the upper surface of the $P^+$ diffusion region 20, an interlayer insulation film 24 is formed, which extends to a part of the upper surface of the $P^+$ diffusion region 21 in the adjacent sense cell region 2.

In the sense cell region 2, $P^-$ type body regions 16 formed on the surface of the drift region 13, emitter regions 17 respectively formed on the surfaces of the body regions 16, and a planar gate 19 formed on the upper surface of the semiconductor substrate 10 are provided. The emitter regions 17 and the drift region 13 are separated from each other by the body regions 16. Around the sense cell region 2, there is formed the $P^+$ diffusion region 21 as an inactive region for element isolation.

The planar gate 19 is formed between the adjacent two emitter regions 17, and is in contact with the two emitter regions 17. The planar gate 19 is disposed at a position opposed to an area of each body region 16 that separates the emitter region 17 and the drift region 13, a part of each emitter region 17 adjacent to the area of the body region 16, and a part of the drift region 13 adjacent to the area of the body region 16. In the planar gate 19, a gate electrode 192 covered with a gate insulation film 191 is provided. Each emitter region 17 is electrically connected with the emitter sense electrode 28. The emitter sense electrode 28 extends from the sense cell region 2 toward the sense cell pad portion 6.

In the sense cell pad portion 6, a P$^+$ diffusion region 22 is formed. On the upper surface, an interlayer insulation film 25 is formed. The interlayer insulation film 25 extends to a part of the upper surface of the P$^+$ diffusion region 21 of the adjacent sense cell region 2.

For example, when the collector electrode 26 is set at a positive potential with respect to the emitter main electrode 27 and the emitter sense electrode 28, and the gate electrodes 182 and 192 are applied with a positive voltage, N type-inverted channels (not shown) are formed as a result in the body regions 14 and 16 opposed to the gate electrodes 182 and 192, respectively. Through the channels, electrons are injected from the emitter regions 15 and 17 into the drift region 13. Whereas, holes are injected from the collector region 11 into the buffer region 12 and the drift region 13. Upon injection of holes which are minority carriers into the drift region 13, conductivity modulation occurs in the drift region 13, resulting in reduction of the resistance of the drift region 13. Such movement of electrons and holes causes flow of the main current and the sense current of the IGBT flowing from the back surface side (collector region 11 side) toward the upper surface side (emitter regions 15 and 17 side) of the semiconductor device.

The ratio $I_2/I_1$ of the sense current $I_2$ to the main current $I_1$ depends upon the ratio $S_2/S_1$ of the area $S_2$ of the sense cell region 2 to the area $S_1$ of the main cell region 1 in the surface of the semiconductor substrate 10. By adjusting the area ratio $S_2/S_1$, it is possible to adjust the ratio $I_2/I_1$ of the sense current $I_2$ to the main current $I_1$. When the ratio $I_2/I_1$ is known, it is possible to detect the main current $I_1$ by detecting the sense current value $I_2$. For example, to the circuit through which the sense current flows, a shunt resistance (resistance value R) is previously connected in series. Thus, the voltage drop $RI_2$ across both ends of the shunt resistance is measured. As a result, the sense current value $I_2$ can be detected.

Figure 4:
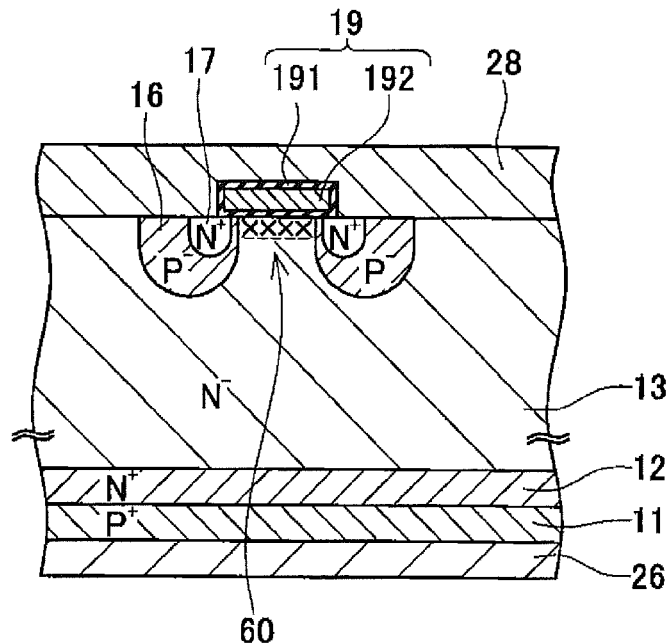
FIG. 4 is a schematic view for illustrating the carrier density of a planar gate type element region.
Figure 5:
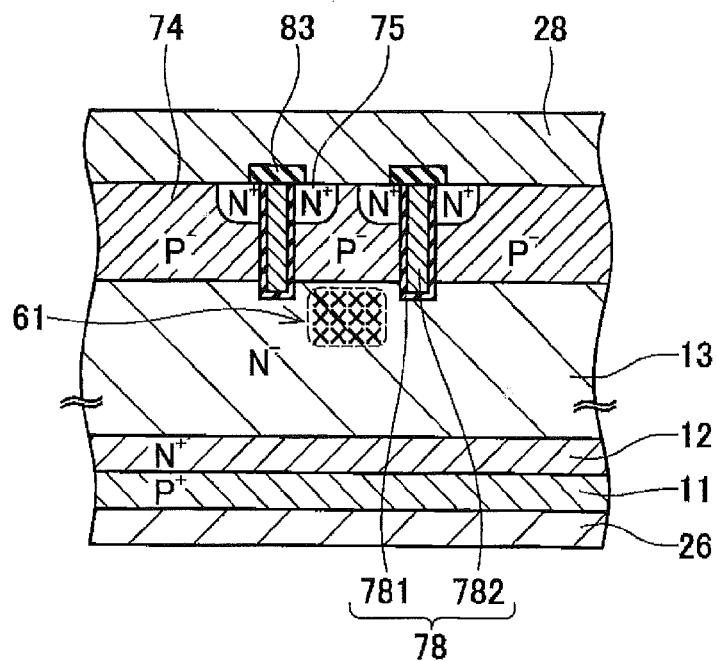
FIG. 5 is a schematic view for illustrating the carrier density of a trench gate type element region.

FIG. 4 is a view for schematically illustrating the carrier density of the vicinity of the gate when the planar gate type element is formed. FIG. 5 is a view for schematically illustrating the carrier density of the vicinity of the gate when the trench gate type elements are formed.

In FIG. 4, upon application of a positive voltage to the gate electrode 192, there is formed a high electron density region along the planar gate 19 in the semiconductor substrate. Further, holes are attracted to the electrons moved to the periphery of the planar gate 19. As a result, as shown in FIG. 4, in the drift region 13 in the vicinity of the planar gate 19, a high hole density region 60 (region surrounded by a broken line) is formed. In the planar gate type element, the size of the high hole density region 60 is less likely to vary according to the length of the planar gate 19 formed in the transverse direction (direction in parallel with the direction of lamination) of the semiconductor substrate.

In FIG. 5, two adjacent trench gates 78 are formed. Each trench gate 78 is in contact with the emitter region 75 on the upper surface side of the semiconductor substrate, penetrates through the body region 74, and reaches the inside of the drift region 13 at the bottom end thereof. In the trench gate 78, there is filled a gate electrode 782 covered with a gate insulation film 781. Between the gate electrode 782 and the emitter electrode 28, an interlayer insulation film 83 is formed. In FIG. 5, upon application of a positive voltage to the gate electrode 782, a high electron density region is formed along the trench gate 78 in the semiconductor substrate. Accordingly, holes are attracted to electrons moved to the periphery of the trench gate 78. As a result, as shown in FIG. 5, in the trench gate type element, in the drift region 13 between the two adjacent trench gates 78, there is formed a high hole density region 61 (region surrounded by a broken line).

In the trench gate type element shown in FIG. 5, the size of the high hole density region 61 varies according to the size (trench depth) of the trench gate 78. Namely, when the trench gate 78 is formed deep, the length of protrusion of the trench gate 78 into the drift region 13 increases. Electrons passed through the channel in the body region 74 pass along the trench gate 78 in the drift region 13. Thus, holes are attracted to the flow of the electrons. As a result, the holes in the drift region 13 are distributed within a wide region in the direction of depth along the trench gate 78. Namely, the region 61 is distributed within a wide region along the direction of depth. On the other hand, when the trench gate 78 is formed shallow, the length of protrusion of the trench gate 78 into the drift region 13 is reduced. This results in that holes in the drift region 13 are distributed within a narrow region in the direction of depth along the trench gate 78. Namely, the region 61 is distributed within a narrow region in the direction of depth. For this reason, variations in the trench depth cause variations in the hole density in the surface of the drift region 13. The variations in the hole density cause variations in resistance component due to the hole density, resulting in variations in resistance of the element. Thus, when the trench gate type elements are formed in the sense cell region 2, variations in sense current due to the variations in the hole density become more likely to be caused.

On the other hand, when the planar gate type element is formed in the sense cell region 2 as in the present embodiment, the hole density is small, and the hole density hardly varies according to the size of the planar gate. For this reason, it is possible to inhibit the variations in the sense current caused by the variations in the hole density. This can stabilize the sense current flowing through the sense cell region 2.

Further, the main cell region 1 is assumed to be of a trench gate type. However, the number of cells in the main cell region 1 is much larger than the number of cells in the sense cell region 2. For this reason, even when variations are caused in shape (depth or the like) of the trench, the variations in the resistance value among the semiconductor devices are small. Therefore, in the semiconductor device of the present embodiment, the variations of the main current flowing through the main cell region 1 is trivial, and the variations of the sense current flowing through the sense cell region 2 is also trivial. For this reason, the sense ratio is stabilized.

As described above, in the present embodiment, the main cell region 1 is assumed to be the trench gate type element region, and the sense cell region 2 is assumed to be the planar gate type element region. This enables high integration in the main cell region 1, and can inhibit the variations in resistance in the sense cell region 2. For this reason, when the semiconductor devices are mass-produced, the current detection precision becomes less likely to vary among the semiconductor devices.

Figure 6:
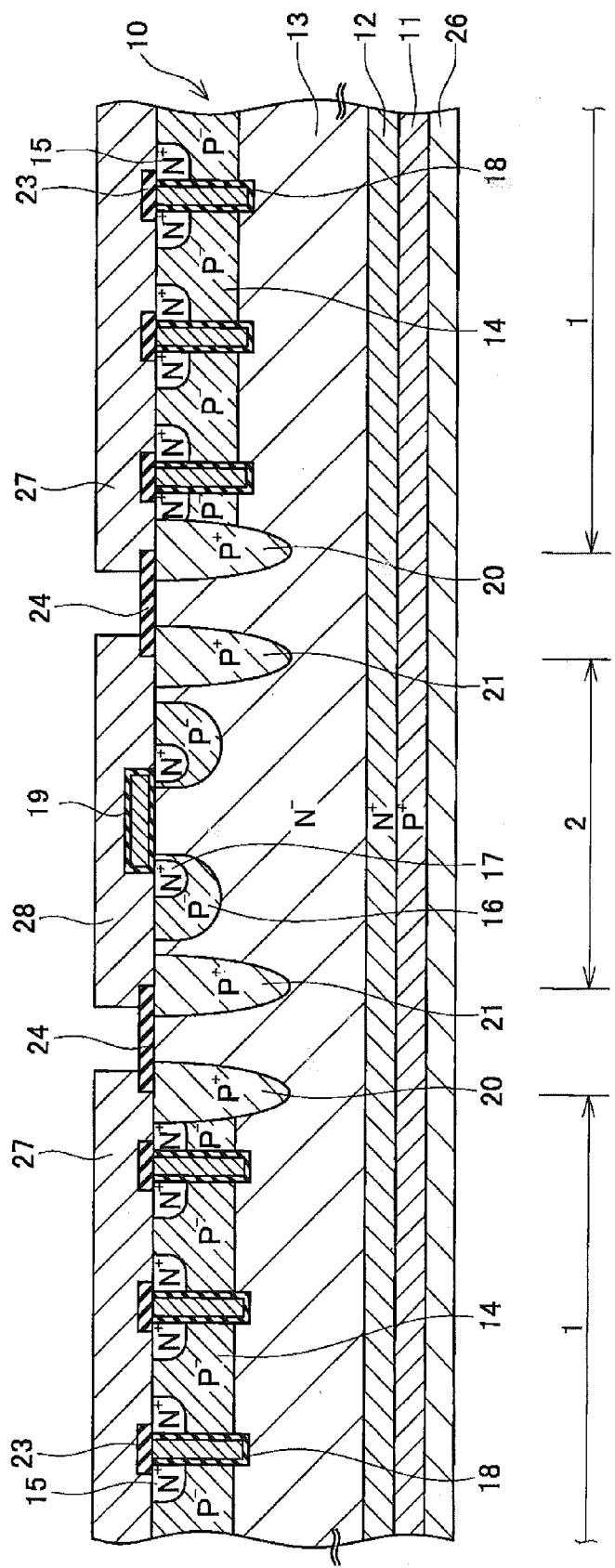
FIG. 6 is a cross-sectional view showing a semiconductor device of a modified example.

Incidentally, in the embodiment, the sense cell region is provided in the vicinity of the peripheral termination structure portion (FLR) of the semiconductor device. However, as shown in FIG. 6, the sense cell region 2 may be surrounded by the main cell region 1. Alternatively, the IGBT may be of a non-punch through type.

Figure 7:
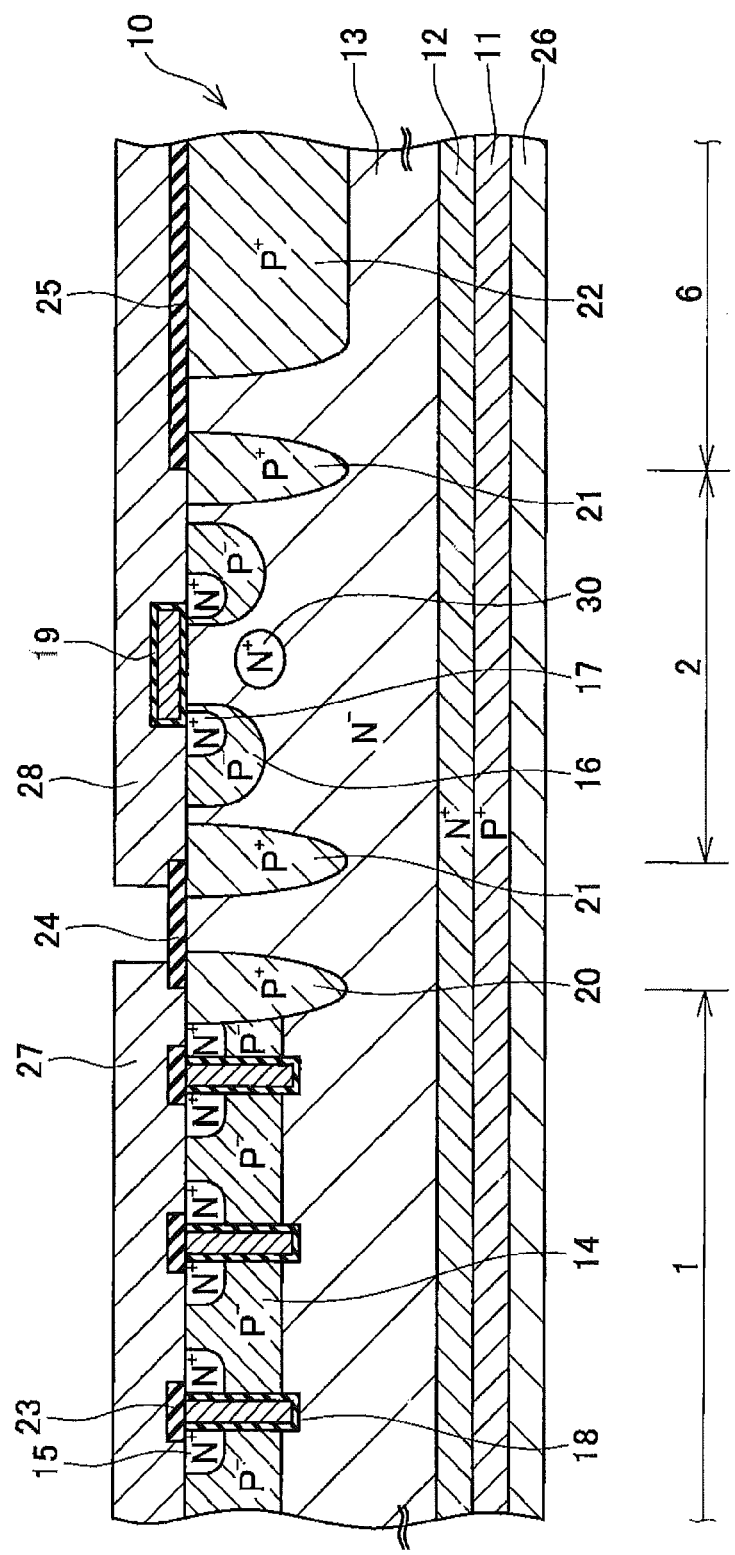
FIG. 7 is a cross-sectional view showing a semiconductor device of a modified example.

Incidentally, in the present embodiment, as shown in FIG. 7, the planar gate type element region in the sense cell region 2 may include an N$^+$ type carrier accumulation region 30 in the drift region 13 situated under the planar gate 19. The carrier accumulation region 30 is formed at a position opposed to the planar gate 19, and between the planar gate 19 and the collector region 11. The carrier accumulation region 30 accumulates holes in the carrier accumulation region 30, while inhibiting holes from passing toward the emitter regions 17. This improves the injection efficiency of electrons from the emitter regions 17 into the drift region 13, resulting in reduction of the resistance value of the planar gate type element region. Incidentally, when the carrier accumulation region 30 is provided, design is required to be made so as to adjust the carrier densities of the carrier accumulation region 30 and the drift region 13 according to the durability to breakdown voltage required of the semiconductor device.

Figure 8:
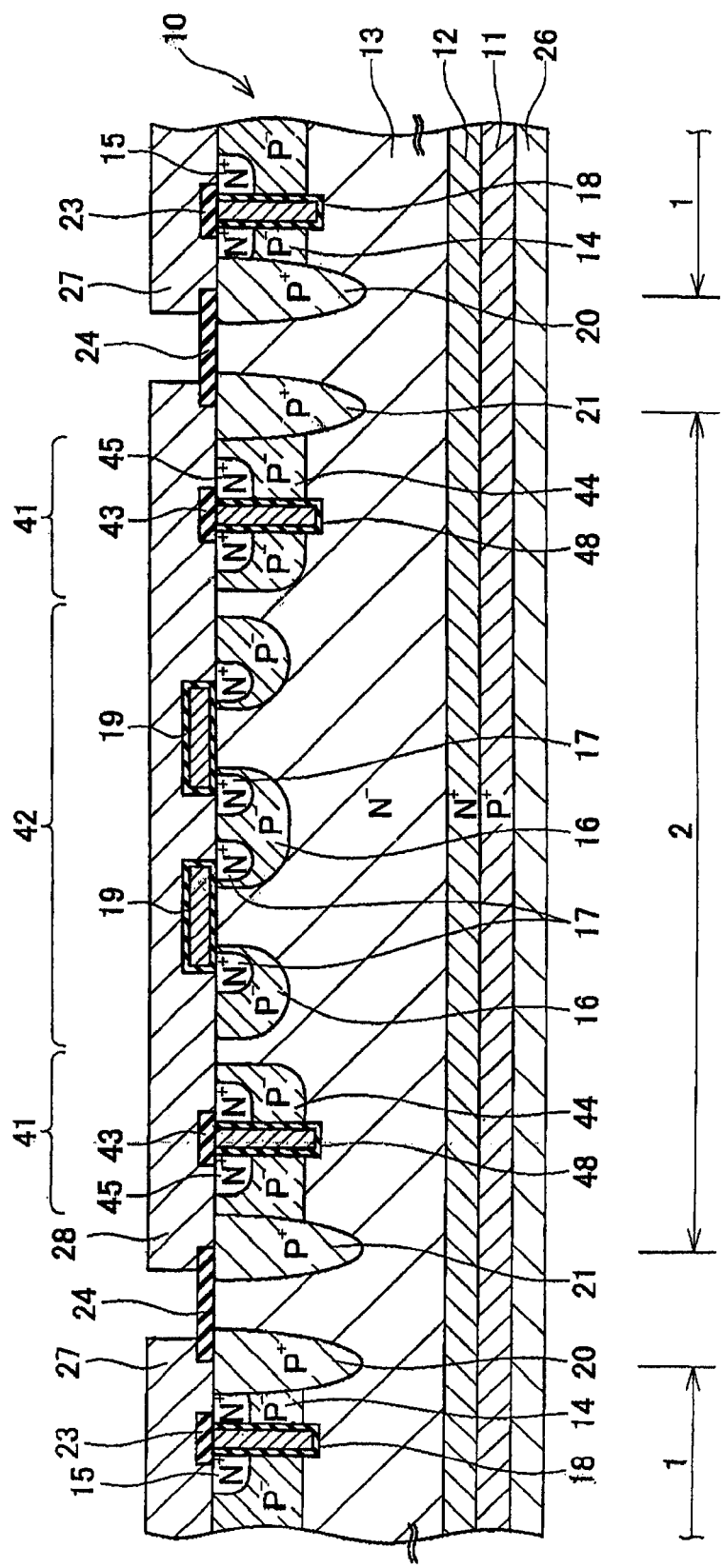
FIG. 8 is a cross-sectional view showing a semiconductor device of a modified example.

Further, in the embodiment, the sense cell region 2 includes only the planar gate type element region. However, as shown in FIG. 8, the sense cell region 2 may include trench gate type element regions 41 and a planar gate type element region 42. When the trench gate type element region 41 is provided in the sense cell region 2, the durability to breakdown voltage of the sense cell region 2 can be improved.

In this case, as shown in FIG. 8, preferably, the planar gate type element region 42 is provided in the center portion of the sense cell region 2, and the trench gate type element regions 41 are provided at the ends of the sense cell region 2. Such a configuration can reduce the variations in the carrier density of the sense cell region 2, so that the current detection density of the sense cell region 2 becomes less likely to vary.

Figure 9:
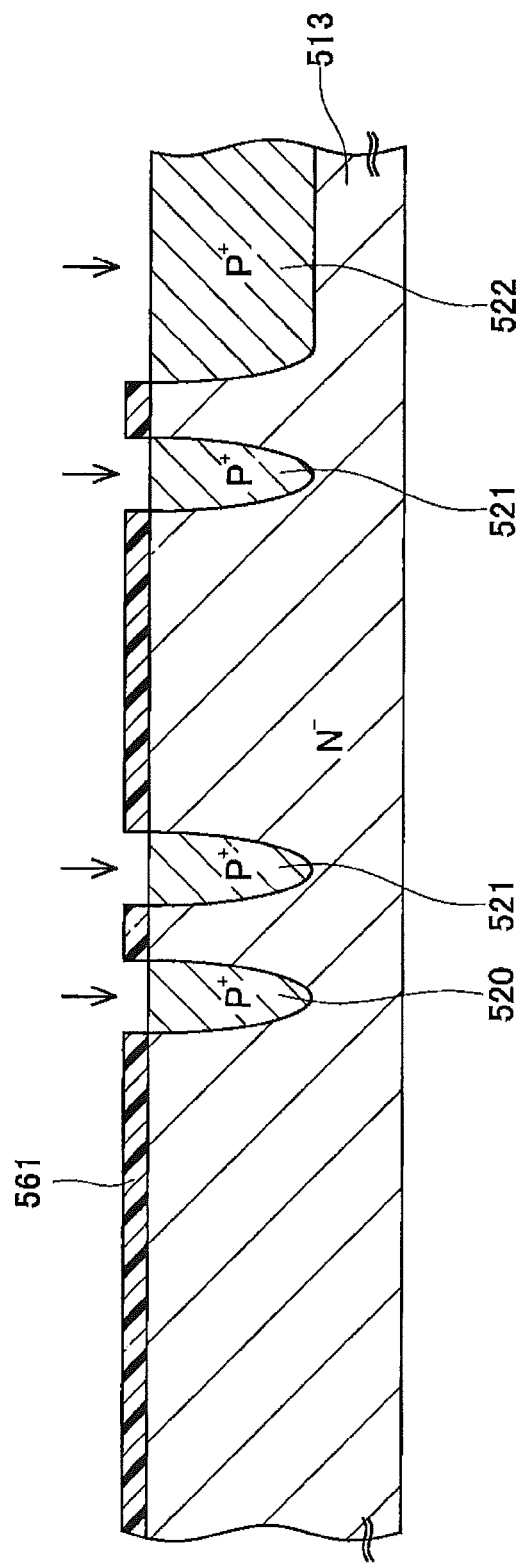
FIG. 9 is a view for illustrating a manufacturing method of the embodiment.

Next, a description will be given of a manufacturing method of the semiconductor device in accordance with the present embodiment. First, as shown in FIG. 9, on an N$^-$ type semiconductor substrate 513 to be the N$^-$ type drift region 13 of the semiconductor device 100, a mask material 561 is formed. Thereby, boron or other ion implantation from the upper surface side of the semiconductor substrate 513 and thermal diffusion treatment are performed. As a result, P$^+$ layers 520 to 522 are formed, and the mask material 561 is removed. As the mask material, for example, a resist, or an oxide film of silicon or the like can be used. The P$^+$ layers 520 to 522 become the diffusion regions 20 to 22 of the semiconductor device 100, respectively. Incidentally, the P$^+$ type diffusion region provided in the FLR in the step shown in FIG. 9 can also be formed at the same time.

Figure 10:
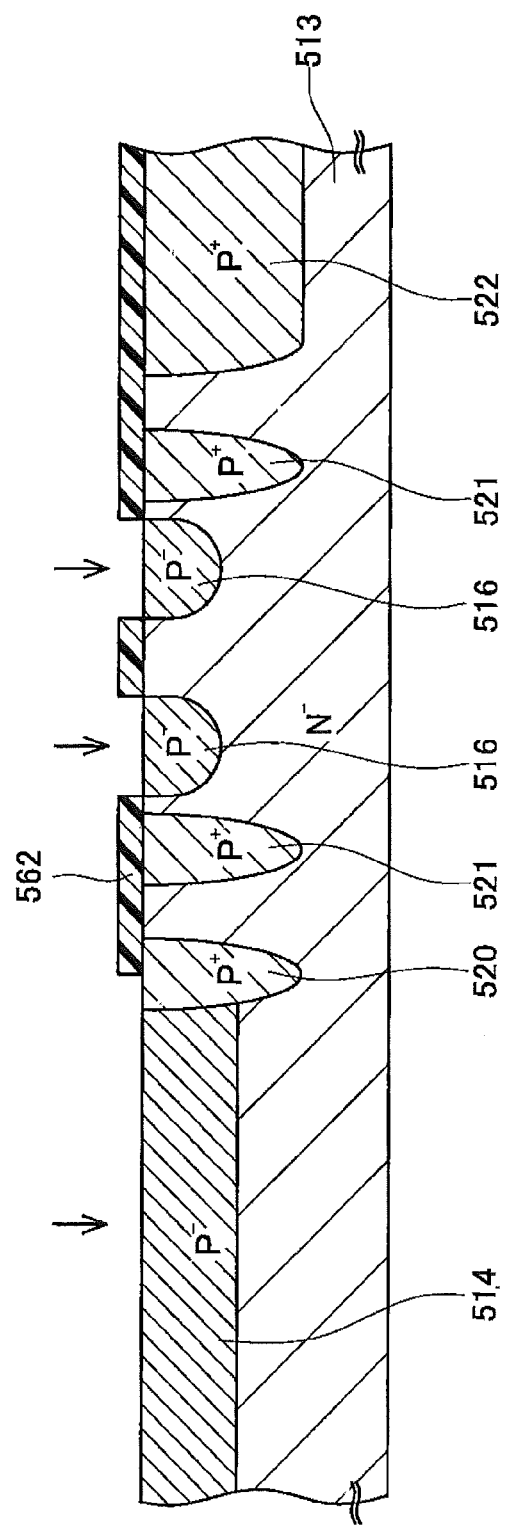
FIG. 10 is a view for illustrating the manufacturing method of the embodiment.

Further, a mask material 562 is formed as shown in FIG. 10. Thus, ion implantation from the upper surface side of the semiconductor substrate 513 and thermal diffusion treatment are performed. As a result, P$^-$ layers 514 and 516 are formed, and the mask material 562 is removed. The P$^-$ layers 514 and 516 become the body regions 14 and 16, respectively.

Figure 11:
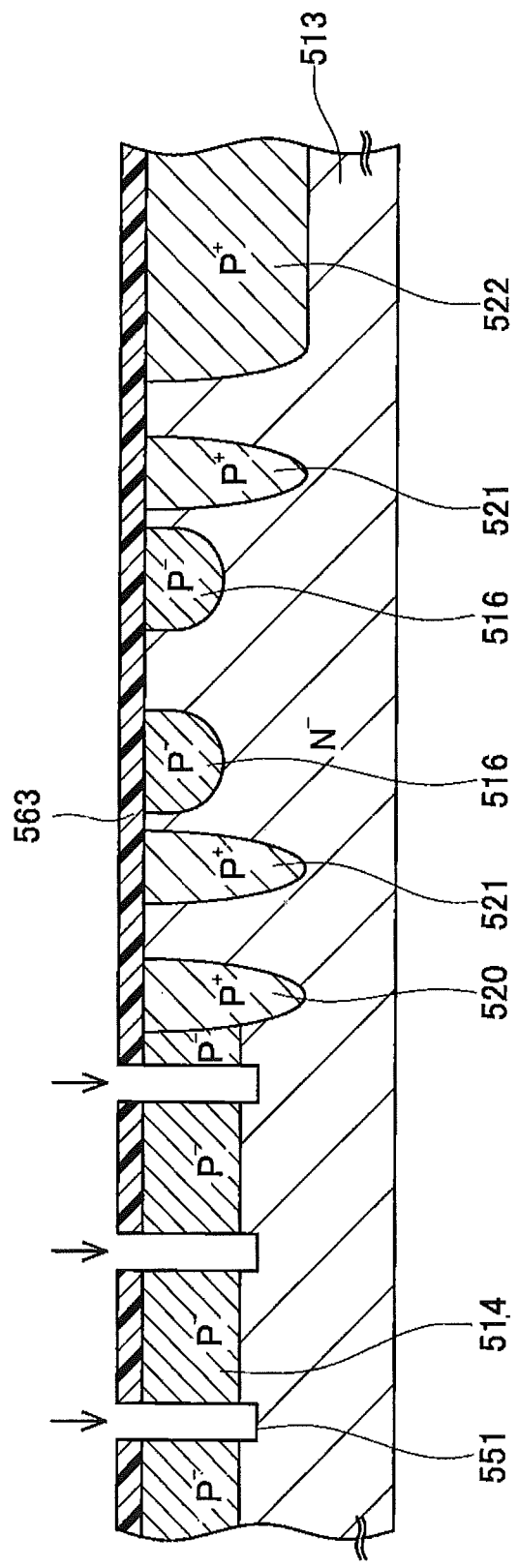
FIG. 11 is a view for illustrating the manufacturing method of the embodiment.

Next, as shown in FIG. 11, on the semiconductor substrate 513, a pattern mask 563 is formed. Then, dry etching such as RIE is performed. The etching forms trenches 551 penetrating through the P$^-$ layer 514 (to be the body region 14). Each trench 551 is formed by etching the semiconductor substrate 513 in the direction of depth thereof according to the position and size of the trench gate 18.

Figure 12:
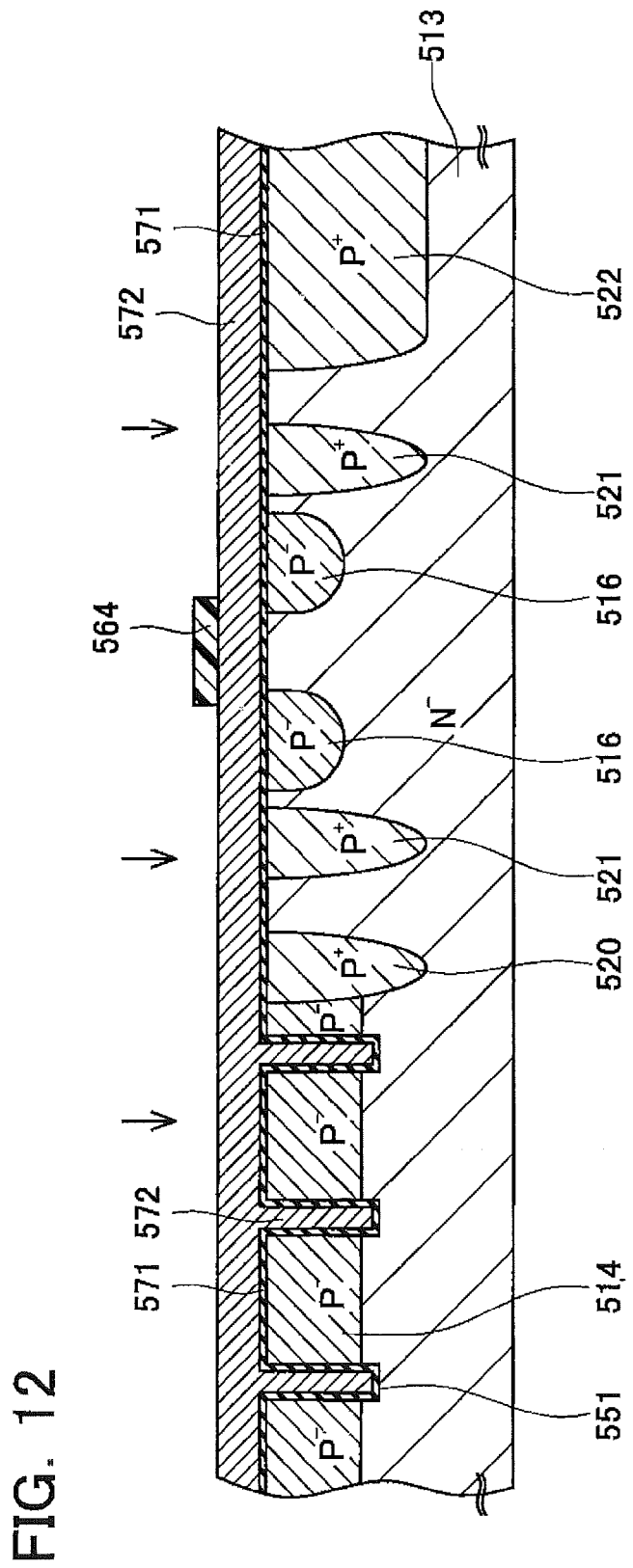
FIG. 12 is a view for illustrating the manufacturing method of the embodiment.
Figure 13:
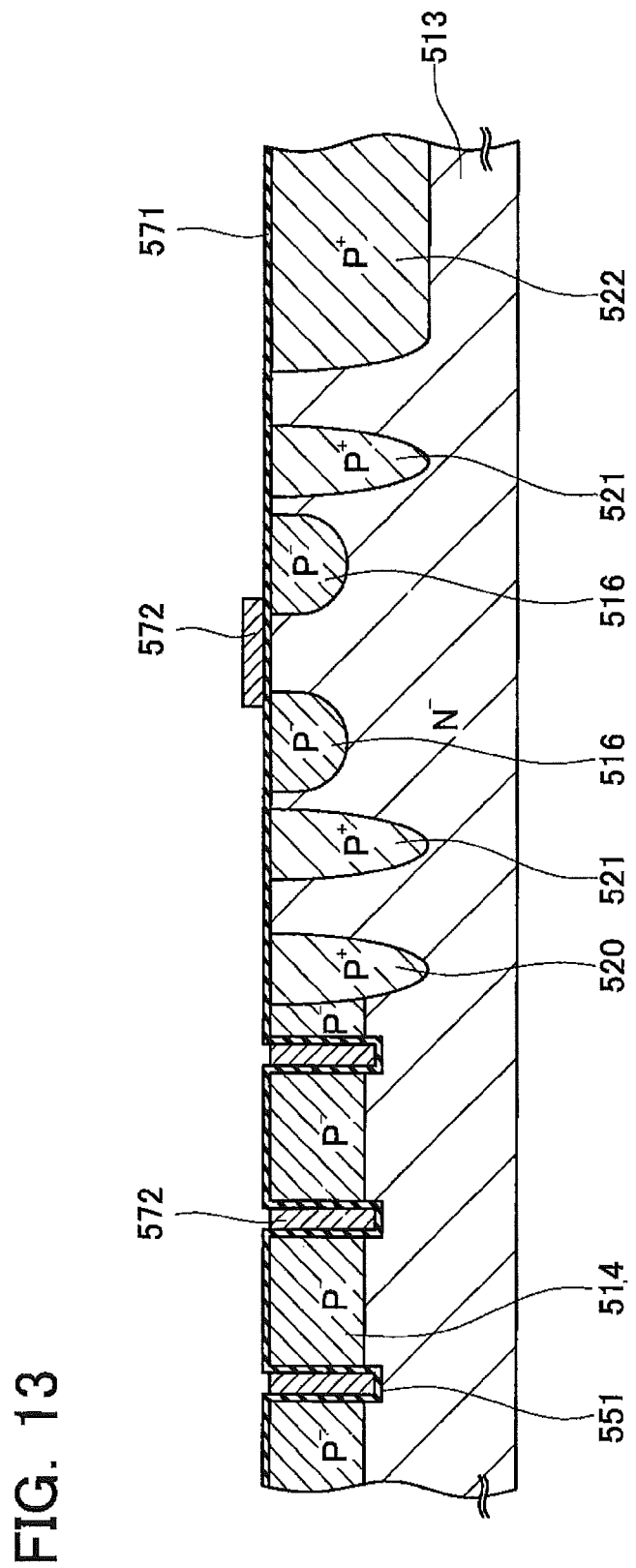
FIG. 13 is a view for illustrating the manufacturing method of the embodiment.

After having removed the pattern mask 563, as shown in FIG. 12, a thermal oxidation treatment is performed to form an insulation film 571, and a gate material 572 such as polysilicon is deposited thereon. Further, a mask material 564 is formed at a position shown in FIG. 12, and the gate material 572 is thereby etched. The mask material 564 is formed according to the position and size of the planar gate 19. After the etching, the mask material 564 is removed, resulting in the state shown in FIG. 13. The gate material 572 results in the gate electrodes 182 and 192 of the semiconductor device 100. The insulation film 571 results in the gate insulation films 181 and 191. Apparent from FIGS. 11 to 13, in the etching step for forming the planar gate 19, the distance of digging by etching is shorter as compared with the etching step for forming the trench gate 18. For this reason, the planar gate 19 can be formed with a higher dimensional precision than the trench gate 18.

Figure 14:
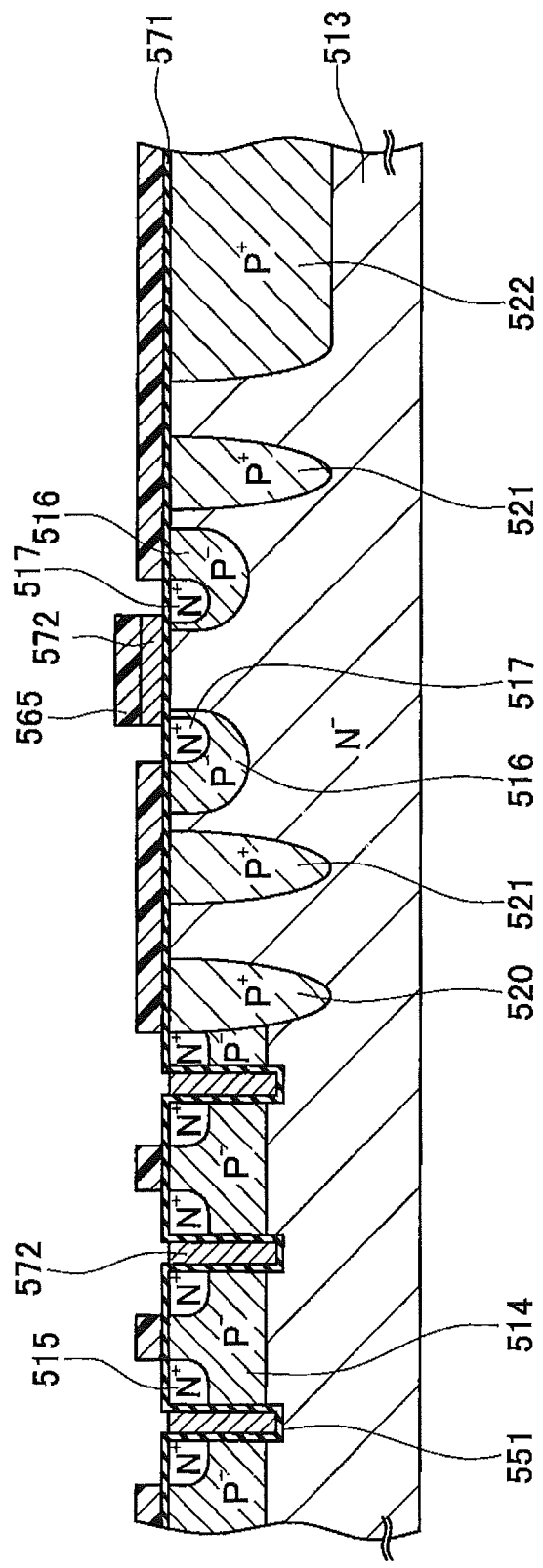
FIG. 14 is a view for illustrating the manufacturing method of the embodiment.

Then, as shown in FIG. 14, on the semiconductor substrate 513, a mask material 565 is formed, and arsenic, phosphorus, or other ion implantation, and thermal diffusion treatments are performed, thereby to form N$^+$ layers 515 and 517. The N$^+$ layers 515 and 517 become the emitter regions 15 and 17 of the semiconductor device 100, respectively.

Figure 15:
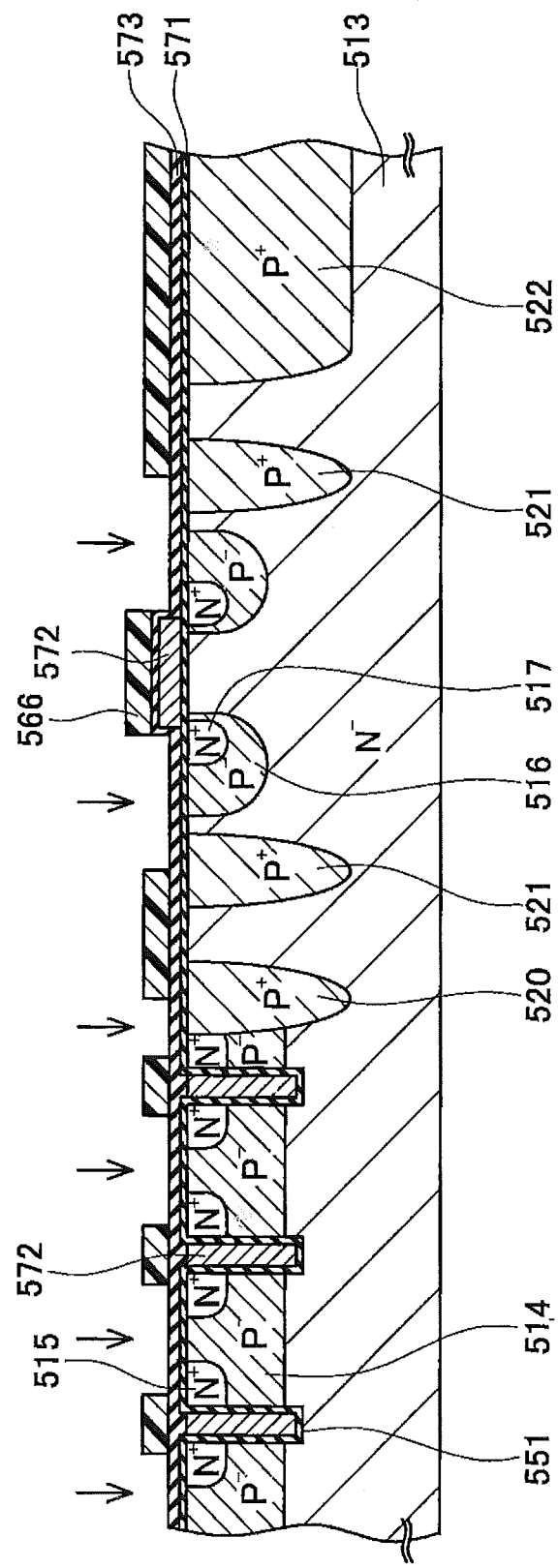
FIG. 15 is a view for illustrating the manufacturing method of the embodiment.
Figure 16:
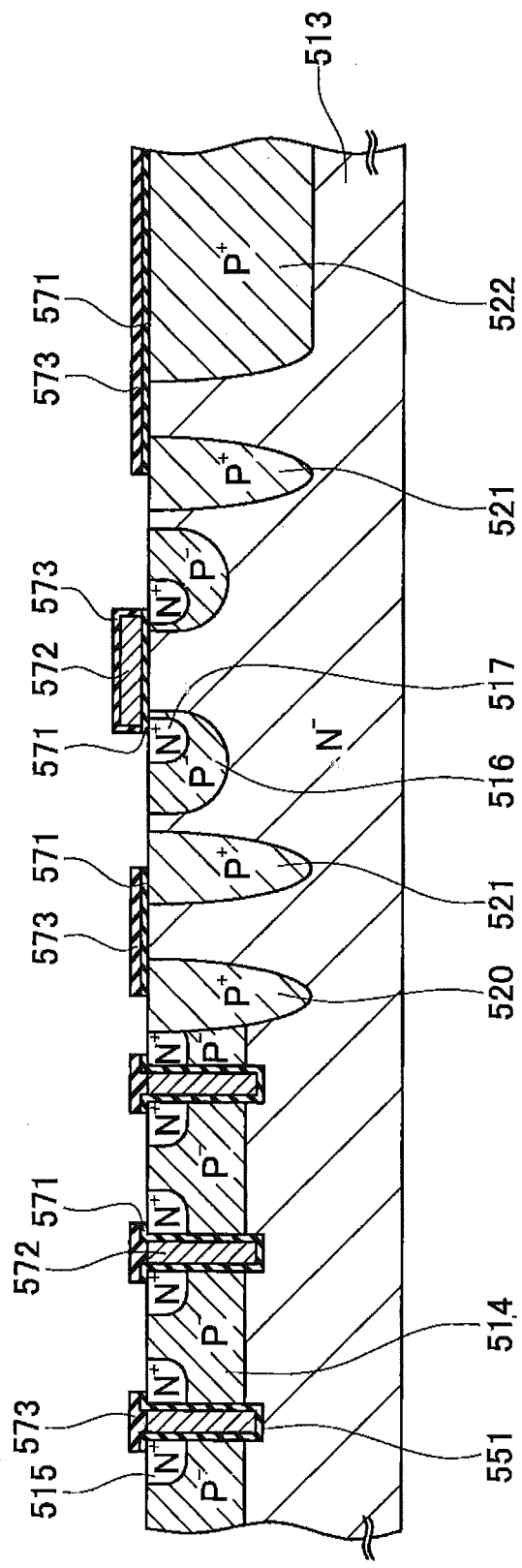
FIG. 16 is a view for illustrating the manufacturing method of the embodiment.

After having removed the mask material 565, as shown in FIG. 15, on the semiconductor substrate 513, an insulation film 573 is formed. Further, on the semiconductor substrate 513, a pattern mask 566 is formed. The insulation films 571 and 573 are etched, and the pattern mask 566 is removed, resulting in the state shown in FIG. 16.

Figure 17:
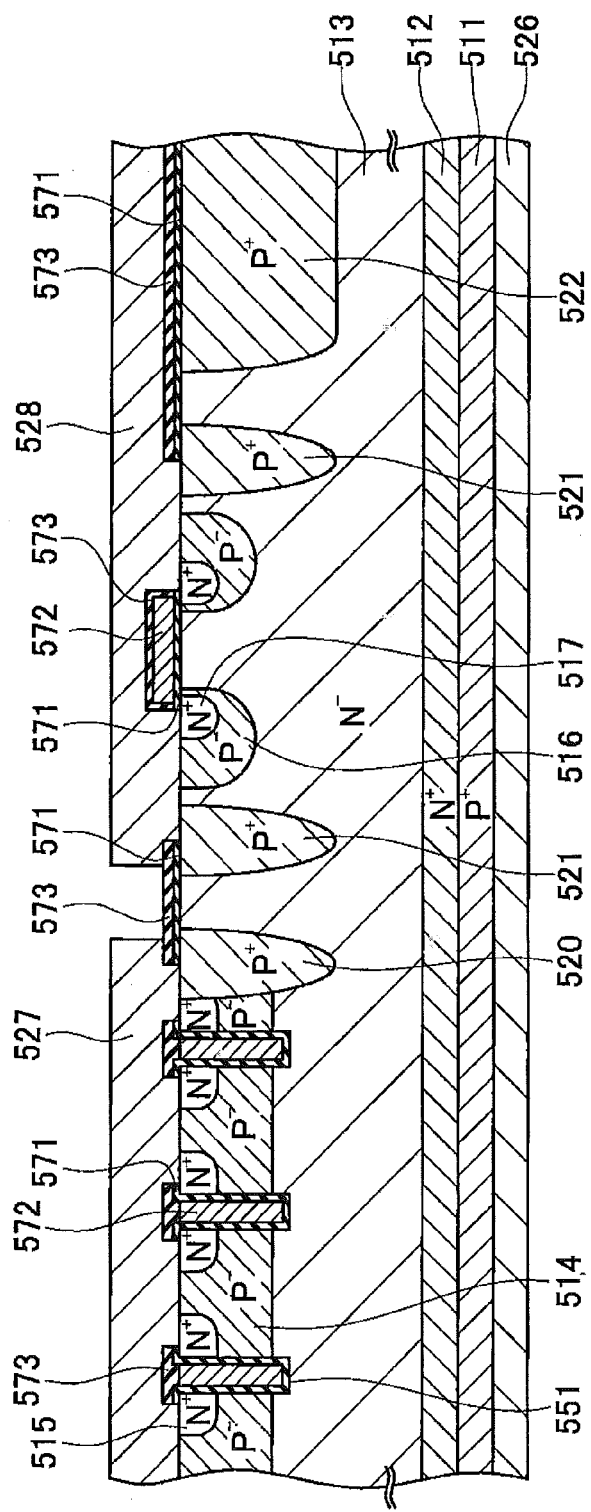
FIG. 17 is a view for illustrating the manufacturing method of the embodiment.
Figure 18:
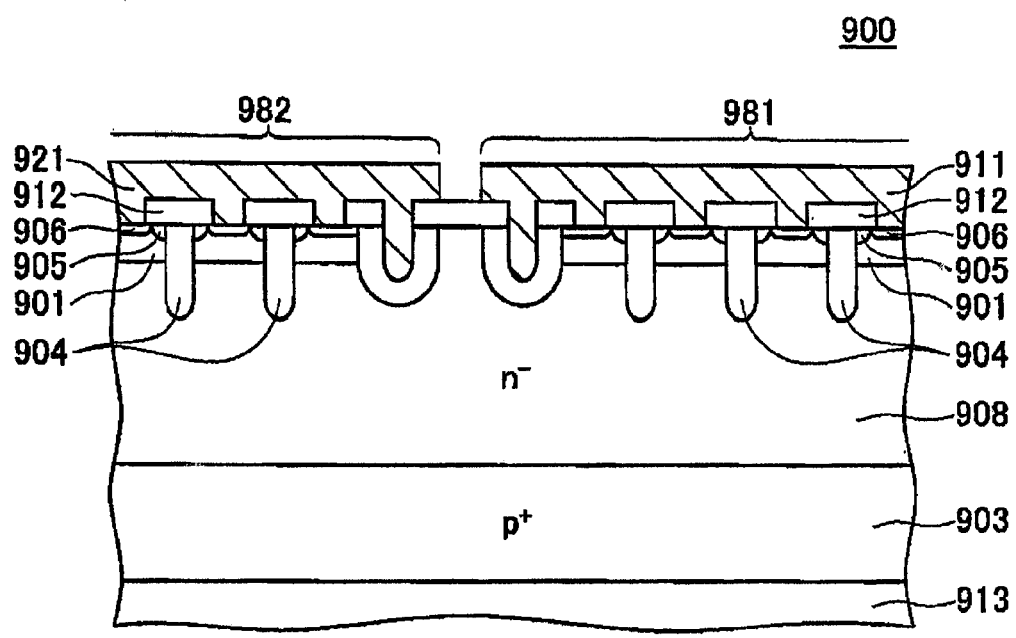
FIG. 18 is a view showing a conventional semiconductor device.

Then, as shown in FIG. 17, on the back surface side of the semiconductor substrate 513, an N$^+$ layer 512 and a P$^+$ layer 511 are formed by ion implantation or the like. Further, as shown in FIG. 17, on the back surface side of the semiconductor substrate 513, an electrode 526 is formed. On the upper surface side of the semiconductor substrate 513, an electrode 527 and an electrode 528 are formed. The N$^+$ layer 512 and the P$^+$ layer 511 become the buffer region 12 and the collector region 11 of the semiconductor device 100, respectively. The electrode 526 becomes the collector electrode of the semiconductor device 100. The electrode 527 becomes an emitter main electrode. The electrode 528 becomes an emitter sense electrode.

As described above, for the semiconductor device in accordance with the present embodiment, the trench gate type main cell region and the planar gate type sense cell region can be simultaneously formed in the semiconductor substrate. Further, as described above, the planar gate can be formed with higher precision as compared with the trench gate.

Although an embodiment of the present teachings has been described using specific terms, such a description is for illustrative purposes only and is not intended to limit the scope of the following claims. The technology described in the claims is to include various modifications and changes made to the specific examples illustrated above.

The technological components illustrated in the present description and the accompanying drawings are designed such that the technical utility thereof is to be exercised either singularly or in combination, and are not limited to the combinations described in the claims upon application. In addition, the technology exemplified in the present description and the accompanying drawings are capable of simultaneously achieving a plurality of objects, whereby achieving one of such objects offers technical utility.

What is claimed is:
1. A bipolar semiconductor device comprising:
a main cell region consisting of a trench gate type element region; and
a sense cell region including a planar gate type element region, wherein
the trench gate type element region comprises:
a first conductivity type collector region,
a second conductivity type drift region laminated on the collector region,
a first conductivity type body region laminated on the drift region,
a second conductivity type emitter region formed on an upper surface side of the body region, and a trench gate type insulation gate extending while penetrating the body region and the emitter region; and
the planar gate type element region comprises:
a first conductivity type collector region,
a second conductivity type drift region laminated on the collector region,
a second conductivity type emitter region formed on an upper surface side of the drift region,
a first conductivity type body region which separates the emitter region from the drift region, and
a planar gate type insulation gate opposing an area of the body region that separates the emitter region and the drift region, a part of the emitter region adjacent to the area of the body region and a part of drift region adjacent to the area of the body region, wherein
a second conductivity type carrier accumulation region is formed only in the planar gate type element region of the sense cell region, and
the carrier accumulation region is formed at a position of the drift region that is opposing the planar gate type insulation gate and is at a depth between the planar gate type insulation gate and the collector region.

2. A bipolar semiconductor device comprising:
a main cell region consisting of a trench gate type element region in which current flows along a thickness direction of the semiconductor device; and
a sense cell region including a planar gate type element region in which current flows along the thickness direction and at least two trench gate type element regions in which current flows along the thickness direction, wherein
the planar gate type element region is located between the at least two trench gate type element regions in the sense cell region.

3. A bipolar semiconductor device of claim 2, further comprising at least two main cell regions,
wherein the sense cell region is located between the at least two main cell regions.

4. A bipolar semiconductor device of claim 3, wherein
one of the at least two trench gate type element regions in the sense cell region is located adjacent to one of the at least two main cell regions, and
another of the at least two trench gate type element regions in the sense cell region is located adjacent to another of the at least two main cell regions.

5. A bipolar semiconductor device of claim 2, wherein
the sense cell region comprises an upper electrode and a lower electrode, the upper electrode being commonly connected to the at least two trench gate type element regions and the planar gate type element region, and the lower electrode being commonly connected to the at least two trench gate type element regions and the planar gate type element region.

* * * * *